United States Patent [19]

Iizuka

[11] Patent Number: 4,646,126
[45] Date of Patent: Feb. 24, 1987

[54] SEMICONDUCTOR DEVICE

[75] Inventor: Tetsuya Iizuka, Funabashi, Japan

[73] Assignee: Kabushiki Kaisha Toshiba, Kawasaki, Japan

[21] Appl. No.: 638,782

[22] Filed: Aug. 8, 1984

[30] Foreign Application Priority Data

Oct. 7, 1983 [JP] Japan .................. 58-187927

[51] Int. Cl.$^4$ ........................................... H01L 27/02
[52] U.S. Cl. ...................................... 357/51; 357/71; 357/68; 357/80; 357/65
[58] Field of Search .............. 357/68, 71, 80, 65, 357/51, 71 P, 75, 73, 81

[56] References Cited

U.S. PATENT DOCUMENTS

| | | |
|---|---|---|
| 3,255,511 | 6/1966 | Weissenstern et al. ............... 357/75 |
| 3,619,731 | 11/1971 | Baker et al. ............................ 357/38 |
| 3,908,187 | 9/1975 | Sheldon et al. ....................... 357/81 |
| 4,017,341 | 4/1977 | Suzuki et al. ........................ 357/50 |
| 4,023,197 | 5/1977 | Magdo et al. ..................... 357/71 P |
| 4,074,342 | 2/1978 | Honn et al. ............................ 357/80 |
| 4,083,063 | 4/1978 | Yu ........................................ 357/38 |
| 4,122,479 | 10/1978 | Sugawara et al. ..................... 357/75 |
| 4,143,385 | 3/1979 | Miyoshi et al. ....................... 357/75 |
| 4,199,778 | 4/1980 | Masuhara et al. .................... 357/68 |
| 4,285,001 | 8/1981 | Gerzberg et al. ..................... 357/51 |
| 4,380,114 | 4/1983 | Webb .................................... 357/38 |

FOREIGN PATENT DOCUMENTS

| | | | |
|---|---|---|---|
| 55-86144 | 6/1980 | Japan ................................... 357/75 |
| 56-93359 | 7/1981 | Japan ................................... 357/51 |
| 0154254 | 9/1983 | Japan ................................... 357/75 |

OTHER PUBLICATIONS

Bodendorf et al., "Active Silicon Chip Carrier", IBM Tech. Disclosure Bulletin, vol. 15, No. 2, 7/72, pp. 656-657.

Sze, *Physics of Semiconductor Devices*, 2nd ed., John Wiley, NY, 1981, p. 493.

Primary Examiner—Martin H. Edlow
Attorney, Agent, or Firm—Finnegan, Henderson, Farabow, Garrett & Dunner

[57] ABSTRACT

Disclosed is a semiconductor device in which IC chips, tested and evaluated as good, are mounted on a silicon substrate, and interconnection wiring layers and pads for IC chips are provided on the substrate with an insulation film interposed therebetween.

10 Claims, 4 Drawing Figures

SEMICONDUCTOR DEVICE

BACKGROUND OF THE INVENTION

The present invention relates to a semiconductor device of the type in which IC (integrated circuit) chips are mounted on a semiconductor substrate.

In one of the known printed circuit boards used for forming a logic system, gold interconnection wiring layers are printed on a ceramic substrate. This known printed circuit board involves many problems. For example, the manufacturing cost is high. The pitch of the interconnection wiring layers is several hundred microns, resulting in a considerably low density of the interconnection wiring layers. With such a large pitch of the interconnection wiring layers, the length of the interconnection wiring layers is correspondingly longer. This results in a large stray capacitance associated therewith and a limitation in the operation speed of the associated device.

To solve such problems, there has been an approach in which many IC chips with different functions are mounted on the substrate, while being interconnected by a wiring layer. Prior to this approach, many IC chips with the same functions were mounted on the substrate. The approach improves the density of the interconnection wiring layers and the operation speed of the device. However, with only one defective IC chip, the entire device must be treated as a bad one. This reduces the production yield. To cope with this problem, there has been proposed another appoach in which a sub-IC chip is used in addition to the regular IC chips, giving a redundancy in use to the device. When a defective IC chip is found, the sub-IC chip is used for replacement with the defective regular IC chip. Therefore, the production yield is improved. The additional use of the redundancy circuit, however, deteriorates the operating speed performance.

SUMMARY OF THE INVENTION

Accordingly, an object of the present invention is to provide a semiconductor device which is low in cost and high in operation speed and integration density.

According to the invention, there is provided a semiconductor device comprising:
a semiconductor substrate;
an IC chip mounted on said substrate;
interconnection wiring layers formed on said substrate with an insulation film;
pads for said IC chip; and
means for connecting said IC chip to said pads.

DETAILED DESCRIPTION OF THE PREFERRED EMBODIMENTS

Figure 1:
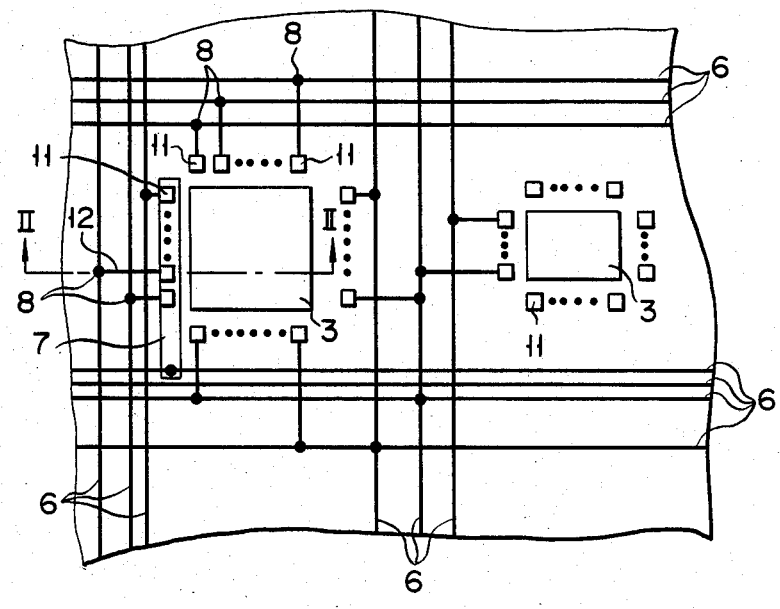
FIG. 1 shows a plan view of a semiconductor device which is an embodiment of the present invention.
Figure 2:
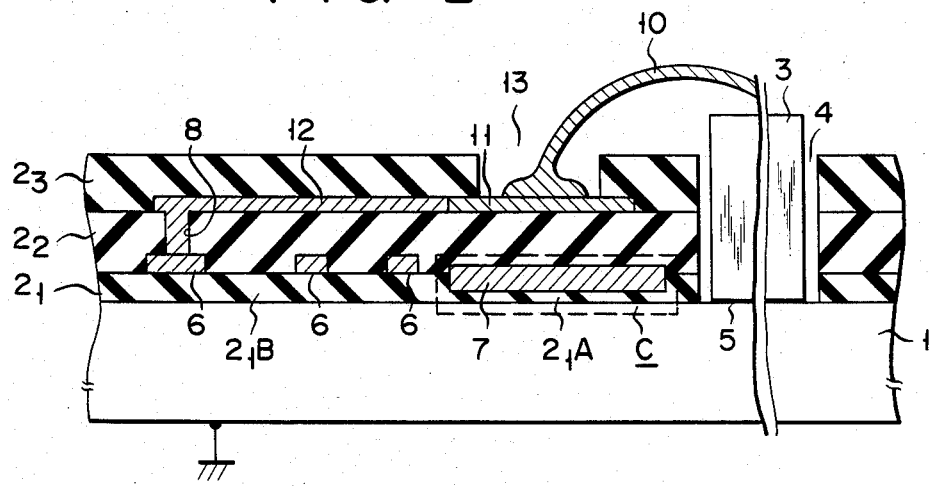
FIG. 2 shows a cross sectional view taken on line II in FIG. 1.

Referring to FIGS. 1 and 2, there is shown a first embodiment of a semiconductor device according to the present invention.

In FIG. 2, a semiconductor substrate 1 is a silicon substrate of high impurity concentration, or low resistance. The silicon substrate 1 is grounded or may be connected to a power source of 5 V, for example. First to third $SiO_2$ films $2_1$, $2_2$ and $2_3$ are layered on the semiconductor substrate 1 in a successive manner. An opening 4 for receiving an IC chip 3 is formed in a predetermined region of the $SiO_2$ films $2_1$, $2_2$ and $2_3$. In order to improve the production yield, the IC chip 3 used is preferably one of the chips tested and evaluated as good. If necessary, an IC chip 3 not tested and evaluated may be used. The IC chip 3 is mounted on the semiconductor substrate 1 by interposing a conductive adhesive layer 5 therebetween. The adhesive layer 5 fixes the IC chip 3 to the semiconductor substrate 1 while allowing electrical and thermal conduction between them. Alternatively, for fixing the IC chip 3 to the semiconductor substrate 1, an alloy layer may be formed therebetween using AuSi, for example. Use of the alloy provides a path allowing heat generated in the IC chip 3 to go to the semiconductor substrate 1. Formed on the first $SiO_2$ film $2_1$ are a plurality of interconnection wiring layers 6 extending vertically and horizontally as viewed in a plan. The $SiO_2$ film $2_1$ is formed relatively thick, and therefore has a small stray capacitance associated therewith. The small stray capacitance provides a small delay of signal transmission on the interconnection ring wiring layers 6. A region $2_1A$ near the opening 4 for IC chip reception is thinner than the other region $2_1B$. An interconnection wiring layer 7 made of polysilicon or metal, for example, is formed on the thin film region $2_1A$. The formation of the thin film region $2_1A$ is made in the same manufacturing step as that of the interconnection wiring layer 6. If necessary, another step may be used for forming the thin film region $2_1A$. The interconnection wiring layer 7 and the thin film region $2_1A$ cooperate to form a grounded capacitance C. The capacitor C serves as a filter for reducing noise coming from a power line when the interconnection wiring layer 7 is used as the power line.

Contact holes 8 are selectively formed in the second $SiO_2$ film $2_2$. Further formed on the $SiO_2$ film $2_2$ are pads 11 made of aluminum and an interconnection wiring layer 12 extended from the pads 11. Connected to the pad 11 is the IC chip 3 through a bonding wire 10. The interconnection wiring layers 12 are respectively in contact with the interconnection layers 6 through the contact holes 8. An opening 13 for guiding the bonding wire 10 to the pad 11 is formed in the region of the third $SiO_2$ film $2_3$ where the pad 11 is provided.

The semiconductor device thus structured has the following effects:

(1) The manufacturing cost is low, since a silicon, not ceramic, substrate is used.

(2) The technique for fabricating an IC is used for the formation of the interconnection wiring layers 6 or 12. Therefore, flatness of the interconnection layers is excellent. Further, the width of the interconnection wiring layer and the pitch of the interconnection layers are very small, 1–2 μm. Therefore, the circuit density is improved, and the length of the interconnection layer is shortened.

(3) The small width and pitch of the interconnection layers brings about the small stray capacitance associated with the interconnection layers. Therefore, the buffer for driving the interconnection layers and their associated circuits may be small in size, leading to an improvement of the operation speed performance.

It is known that if charge and discharge time of the signal line is indefinitely small, the signal transmission speed indefinitely approaches the propagating speed of light on the signal line. In light of this, the short length of the interconnection wiring layer in this embodiment is used for the signal line, the signal transmission distance is short and this provides a lessened transmission delay signal.

(4) The capacitor C formed by the interconnection wiring layer 7 and the thin film region $2_1A$ is closer to the opening 4 in which the IC chip 3 is set. Therefore, an inductance formed associated therewith is small, so that highly effective filtering by the capacitor C is possible. As a result, when the interconnection layer is used as a power line, noise interference is minimized.

(5) The components formed on the semiconductor substrate 1 are mainly the interconnection layers 6 and 7, the pads 11, and the interconnection wiring layers 12. Therefore, the production yield of the semiconductor devices is high. This is further enhanced when the tested and selected IC chip 3 is used.

Figure 3:
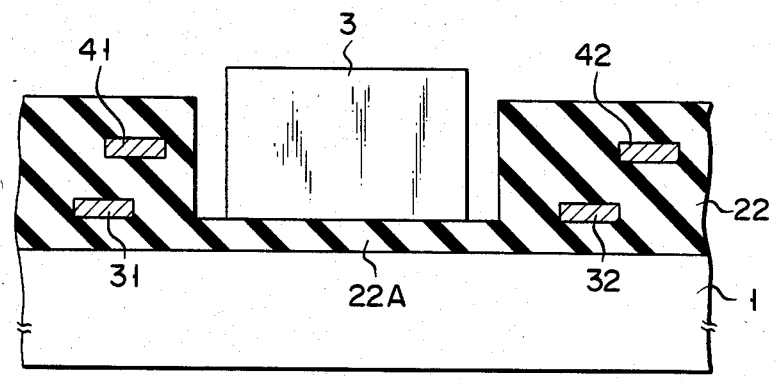
FIG. 3 shows a cross sectional view of another embodiment of a semiconductor device according to the present invention.

FIG. 3 shows another embodiment of a semiconductor device according to the present invention. Only different portions and components from those in the first embodiment will be given for simplicity of explanation. As shown, the IC chip 3 is placed on the semiconductor substrate 1 through an insulating film 22A as a thin portion of an insulating film 22. Therefore, the IC chip 3 is electrically isolated from the semiconductor substrate 1. This feature allows individual potentials to respectively be applied to the IC chip 3 and the semiconductor substrate 1. Reference numerals 31 and 32 designate first interconnection wiring layers, and reference numerals 41 and 42 designate second interconnection layers. This embodiment can attain the effects comparable with those of the first embodiment.

Figure 4:
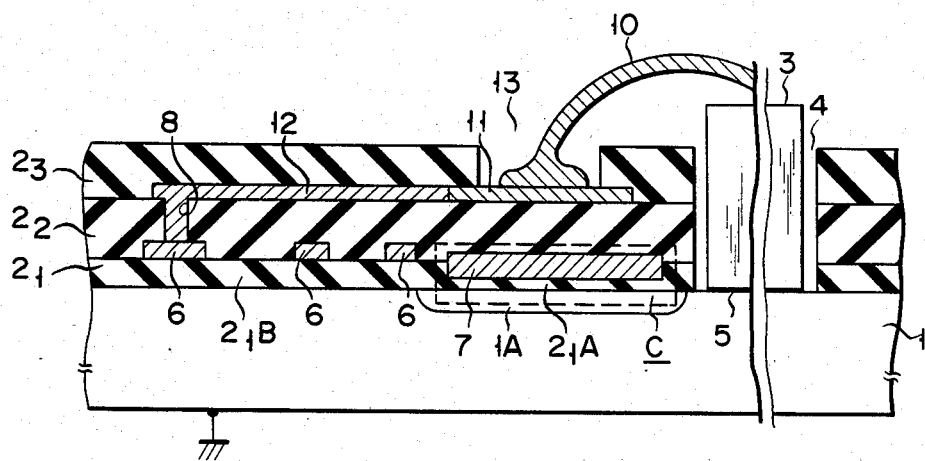
FIG. 4 shows a partial cross sectional view of a yet another embodiment of a semiconductor device according to the present invention.

FIG. 4 shows yet another embodiment of a semiconductor device according to the present invention. In this embodiment, the semiconductor substrate 1 has a low impurity concentration, not a high impurity concentration. High impurity concentration is found in the region 1A of the semiconductor substrate 1 corresponding to the region where the interconnection wiring layer 7 is formed. The remaining portions of this embodiment are the same as those of the FIG. 2 embodiment. No futher explanation will be given.

Since the region 1A of the semiconductor substrate 1 is the high impurity concentration region, the interconnection layer 7 and the thin film region $2_1A$ and the high impurity concentration region 1A cooperatively form the capacitor C. If the interconnection wiring layer 7 is used as the power line, the capacitor C effectively reduces noise from the power line as in the previous embodiments.

While in the above-mentioned embodiment, the interconnection layers are double layered, it may be formed by a single layer or three or more layers. Silicon of the interconnection layers may be replaced by other suitable material, for example, aluminum. Further, the silicon substrate may be replaced by a substrate in which a semiconductor layer is formed on the insulating substrate made of sapphire, for example.

It should be understood that the present invention may variously be changed and modified within the scope of the present invention.

As seen from the foregoing description, the present invention provides a semiconductor device with high speed, high integration density and good reliability.

What is claimed is:

1. A semiconductor device comprising:
    a semiconductor substrate;
    an IC chip mounted directly on a first region of said substrate;
    a first insulation film formed on said substrate, said first insulation film having one region thinner than any other region;
    an interconnection wiring layer serving as a power line formed on said one region of said first insulation film, said first insulation film and said interconnection wiring layer and said substrate forming a capacitor to serve as a filter for reducing noise coming from said power line;
    a second insulation film formed on said interconnection wiring layer;
    a conductive bonding layer for forming an electrical connection for said IC chip, said conductive bonding layer being formed on said second insulation film above said interconnection wiring layer; and
    means for connecting said IC chip and said conductive bonding layer.

2. A semiconductor device according to claim 1, in which said interconnection wiring layer is made of polycrystalline silicon.

3. A semiconductor device according to claim 1, in which said interconnection wiring layer is made of aluminum.

4. A semiconductor device comprising:
    a semiconductor substrate;
    an IC chip mounted directly on a first region of said substrate;
    a first insulation film formed on said substrate, said first insulation film having one region thinner than any other region;
    an interconnection wiring layer, located in close proximity to said first region of said substrate wherein said IC chip is placed, said interconnection wiring layer serving as a power line formed on said one region of said first insulation film, said first insulation film and said interconnection wiring layer and said substrate forming a capacitor to serve as a filter for reducing noise coming from said power line;
    a second insulation film formed on said interconnection wiring layer;
    a conductive bonding layer for forming an electrical connection for said IC chip, said conductive bonding layer being formed on said second insulation film above said interconnection wiring layer; and
    means for connecting said IC chip and said conductive bonding layer.

5. A semiconductor device according to claim 1, in which said substrate is made of silicon.

6. A semiconductor device according to claim 5, in which said substrate has a high impurity concentration.

7. A semiconductor device according to claim 4, in which substrate has a high impurity concentration.

8. A semiconductor device according to claim 4, in which said substrate is made of silicon.

9. A semiconductor device according to claim 4, in which said interconnection wiring layer is made of polycrystalline silicon.

10. A semiconductor device according to claim 4, in which said interconnection wiring layer is made of aluminum.

* * * * *